United States Patent
Davis

(10) Patent No.: US 6,711,518 B1
(45) Date of Patent: Mar. 23, 2004

(54) METHOD FOR ELECTRONICALLY ALIGNING THE FREQUENCY OF AN INFRARED TRANSMITTER

(75) Inventor: J. Roger Davis, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 285 days.

(21) Appl. No.: 09/644,445

(22) Filed: Aug. 23, 2000

(51) Int. Cl.$^7$ .............................................. G01R 35/00
(52) U.S. Cl. .................. 702/106; 702/106; 702/75; 702/124; 702/183; 331/64; 331/65; 331/107; 331/117; 327/106; 327/107; 374/17; 374/21; 374/56
(58) Field of Search .................. 702/57, 64, 75–76, 702/99, 106, 107, 117, 124, 126, 132–136, 183, 189; 324/681, 682, 684, 658, 720, 600, 601; 331/44, 48, 64, 65, 25, 28, 107, 108, 110, 111, 117; 327/106, 107, 129; 374/17, 21, 41, 56, 117, 172, 183, 197, 210, 185

(56) References Cited

U.S. PATENT DOCUMENTS 5,019,791 A * 5/1991 Cohen .......................... 331/96
6,323,739 B1 * 1/2000 Andrews ..................... 331/117

* cited by examiner

Primary Examiner—Marc S. Hoff
Assistant Examiner—Elias Desta
(74) Attorney, Agent, or Firm—Stefan V. Chmielewski

(57) ABSTRACT

A method is provided for aligning the center frequency of an infrared transmitter. The method comprises the steps of: (a) providing a voltage-controlled oscillator for driving the infrared transmitter, where the oscillator is adapted to receive a bias voltage from a microprocessor; (b) applying a bias voltage to the oscillator; (c) receiving an output signal from the infrared transmitter into an infrared receiver; (d) determining a frequency associated with the output signal; and (e) adjusting the bias voltage based on the frequency associated with the output signal, thereby aligning the center frequency of the infrared transmitter.

8 Claims, 3 Drawing Sheets

METHOD FOR ELECTRONICALLY ALIGNING THE FREQUENCY OF AN INFRARED TRANSMITTER

TECHNICAL FIELD

The present invention relates generally to an oscillator circuit associated with a transmitter device and, more particularly, to a method for electronically aligning the frequency of an oscillator circuit that may be used to drive an infrared transmitter.

BACKGROUND OF THE INVENTION

An infrared transmitter is designed to broadcast a modulated signal about a carrier frequency, and thus operates in conjunction with an oscillator circuit. It is well known to use a programmable phase lock loop (PLL) design to synthesize the frequency of the oscillator circuit. In this case, a microprocessor may be used in conjunction with the phase lock loop circuit to control the frequency of the oscillator circuit. Although PLL-controlled oscillators achieve good control over the center frequency, these types of circuits typically cost more than a conventional LCR-based oscillator.

In contrast, conventional LCR-based oscillators provide open loop control over the center frequency. Due to variations in the manufacturing process, the center frequency may vary between oscillators. Without a way to electrically control the center frequency of the oscillator, many well known mechanical alignment techniques are typically incorporated into the manufacturing process. In this way, the desired center frequency of the oscillator is accurately established. Unfortunately, manual alignment further increases the manufacturing costs associated with these types of oscillator circuits. The cost associated with mechanical alignment becomes more critical as the circuits are replicated in order to provide multiple channels within a single application.

Therefore, it is desirable to provide a method for electronically aligning the center frequency of an LCR-based oscillator circuit that may be used to drive an infrared transmitter.

SUMMARY OF THE INVENTION

In accordance with the present invention, a method is provided for aligning the center frequency of an infrared transmitter. The method comprises the steps of: (a) providing a voltage-controlled oscillator for driving the infrared transmitter, where the oscillator is adapted to receive a bias voltage from a microprocessor; (b) applying a bias voltage to the oscillator; (c) receiving an output signal from the infrared transmitter into an infrared receiver; (d) determining a frequency associated with the output signal; and (e) adjusting the bias voltage based on the frequency associated with the output signal, thereby aligning the center frequency of the infrared transmitter.

For a more complete understanding of the invention, its objects and advantages, refer to the following specification and to the accompanying drawings.

DESCRIPTION OF THE PREFERRED EMBODIMENT

Figure 1:
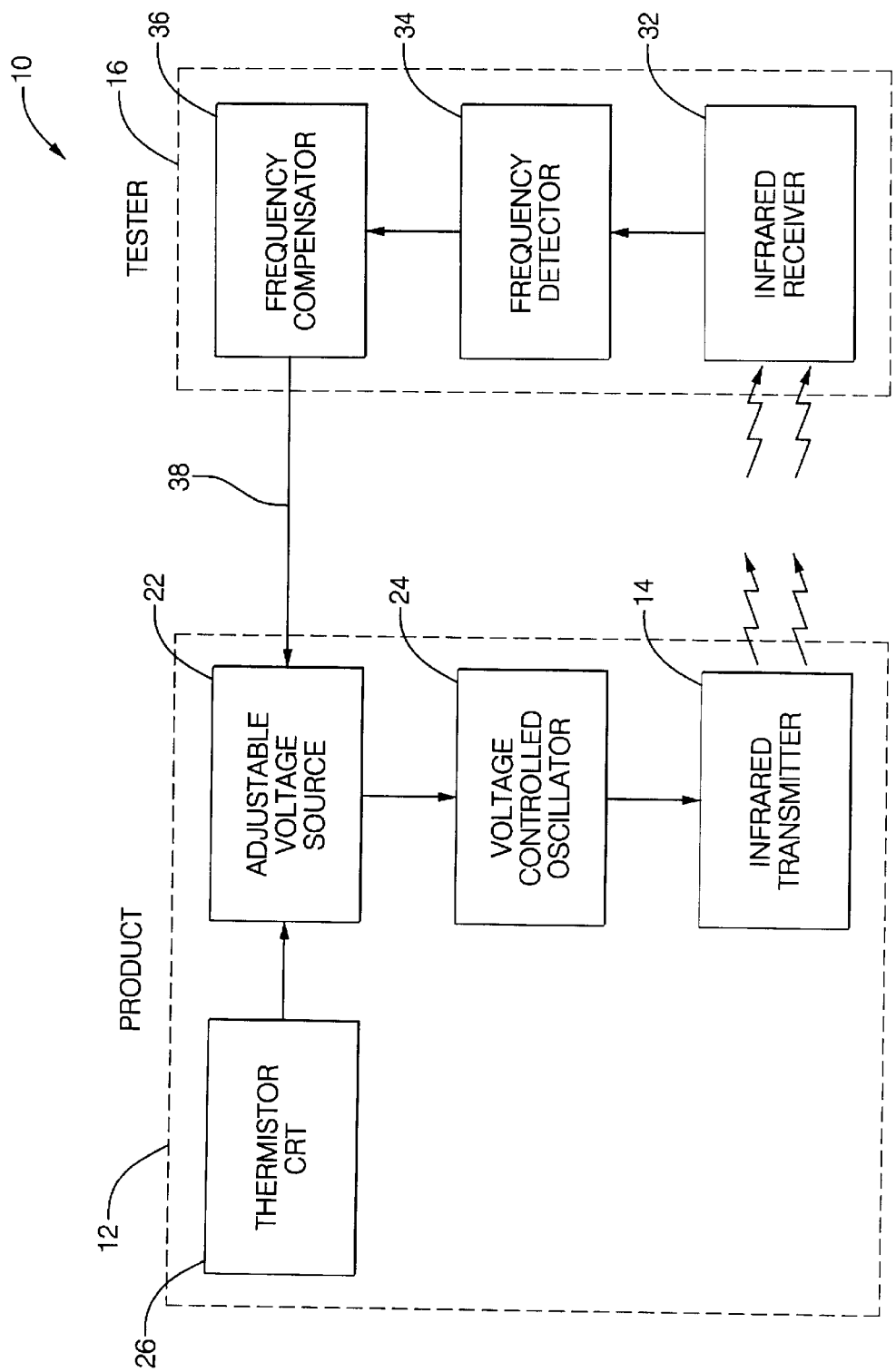
FIG. 1 is a block diagram of an alignment and temperature compensation system for an infrared transmitter in accordance with the present invention.

An alignment and temperature compensation system 10 embodying features of the present invention is depicted in FIG. 1. The alignment and temperature compensation system 10 generally includes a product 12 (e.g., a circuit board is used in the transmitter portion of a wireless headphone system) and a tester device 16. The product 12 further includes an adjustable voltage source 22, a voltage-controlled oscillator circuit 24, and at least one infrared transmitter device 14. The oscillator circuit 24 is adapted to receive a bias voltage from the adjustable voltage source 22, where the bias voltage determines a portion of the capacitance associated with the oscillator circuit 24. In this way, adjustments to the bias voltage control the center frequency of the oscillator circuit 24. The oscillator circuit 24 in turn drives the infrared transmitter device 14. While the following description is provided with reference to an infrared transmitter, it is readily understood that the broader aspects of the present invention are applicable to other types of wireless transmitter devices.

The tester device 16 is provided for electronically aligning the center frequency associated with the infrared transmitter 14. The tester device 16 generally includes an infrared receiver device 32, a frequency detector component 34 and a frequency compensation component 36. A communication link 38 enables the frequency compensation component 36 to effectuate any adjustments in the bias voltage generated by the adjustable voltage source 22. As will be more fully explained below, a thermistor circuit 26 may optionally be connected to the voltage source 22 in order to improve the temperature stability of the oscillator circuit 24.

In accordance with the present invention, a recently manufactured product enters a test station that houses the tester device 16. Rather than mechanically aligning the oscillator circuit 24, power is applied to the product 12, whereby an output signal is generated from the infrared transmitter 14. The infrared receiver device 32 is aligned with the product 12 such that it receives the output signal from the infrared transmitter 14. The frequency detector component 34 determines the frequency associate with the output signal. In view of the desired center frequency, the frequency compensation component 36 calculates an adjustment value for the bias voltage and then communicates this adjustment value via the communication link 38 to the product 12.

In response to the adjustment value, the product 12 is then able adjust the bias voltage generated by the adjustable voltage source 22. The alignment process may be repeated until the desired center frequency for the product is achieved. It is envisioned that the frequency compensation component 36 may also calculate the offset between the frequency associated with output signal and the desired frequency, and then the product 12 would compute the appropriate adjustment value for the bias voltage.

Figure 2:
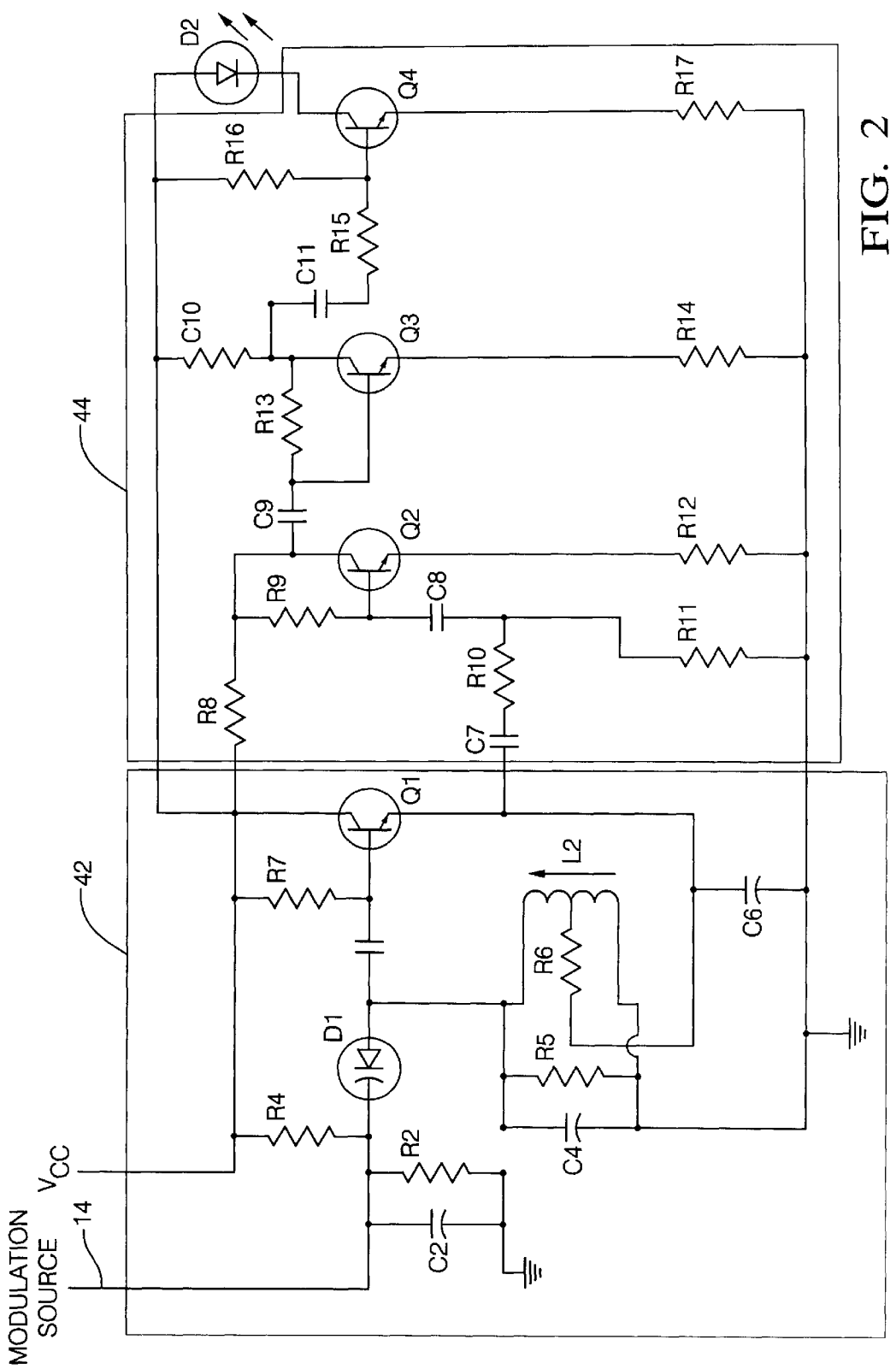
FIG. 2 is a schematic of a conventional LCR-based oscillator circuit.

For illustration purposes, a detailed schematic of a conventional LCR-based oscillator circuit 42 is shown in FIG. 2. The oscillator 42 is adapted to receive a modulated input signal 44. The output of the oscillator circuit 42 is then used to drive one or more infrared emitter diodes D2. An amplification circuit 44 may optionally be used to boost the drive signal to infrared emitter diode D2. Although the invention is not limited thereby, an exemplary three-stage amplifier circuit is shown in FIG. 2.

The oscillator circuit is 42 further defined as a Hartley oscillator circuit. The principal components of the Hartley oscillator circuit include a first resistor R5 and an inductor L2 which is tapped through the use of a second resistor R6 to form two inductors. The capacitor portion of the oscillator circuit is derived from a first capacitor C2 in series with the capacitance value associated with a varactor diode D1 which collectively are positioned in parallel with a second capacitor C4. The nominal capacitance provided by the varactor diode D1 is fix biased by the values of two additional resistors, R2 and R4. The remainder of the oscillator circuit 42 includes a first transistor Q1, another resistor R7 and two additional capacitors C6 and C5. In this embodiment, the inductor L2 must be mechanically aligned to set the desired center frequency of the oscillator. Although a Hartley oscillator circuit is presently preferred, it is envisioned that other types of voltage-controlled oscillator circuits fall within the broader scope of the present invention.

Figure 3:
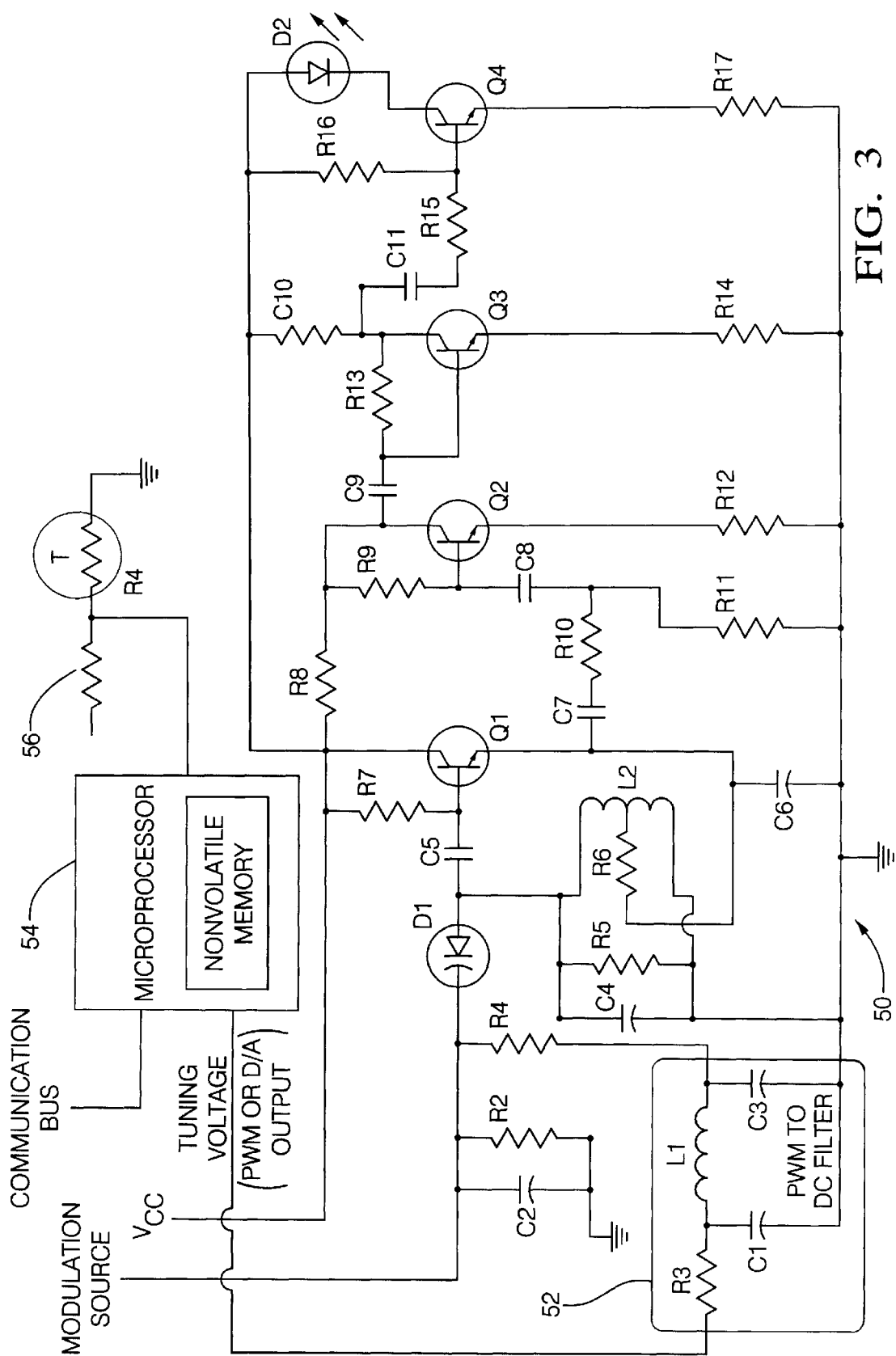
FIG. 3 is a schematic of an exemplary LCR-based oscillator circuit that is modified in accordance with the present invention.

In FIG. 3, a similar LCR-based oscillator circuit 50 is modified in order to facilitate electronic alignment of the center frequency in accordance with the present invention. The oscillator circuit has been adapted to receive a bias voltage from an adjustable voltage source, but otherwise the basic components and principles of operation are generally as described above. More specifically, resistor R4 is connected via a filter circuit 52 to a microprocessor 54. In operation, the microprocessor 54 controls the bias voltage applied to the varactor diode D1. By controlling the bias voltage, the microprocessor is able to control the capacitance value across the varactor diode D1 which in turn determines the center frequency of the oscillator circuit. As result, the microprocessor provides software control over the center frequency of the oscillator and thus eliminates the need for mechanical alignment of the oscillator. The filter circuit 52 is used to smooth the pulse width modulated output signal from the microprocessor 54 into a clean DC bias voltage that can be input into the oscillator circuit 50. It is envisioned that other types of filtering circuits may be used to achieve the appropriate signal form for inputting into the oscillator circuit 50.

To improve temperature stability, a thermistor circuit 56 may be connected to the microprocessor 54. The thermistor circuit 56 generates an input voltage signal proportional to the ambient temperature adjacent the oscillator circuit 50. As will be apparent to one skilled in the art, an appropriate algorithm or look-up table may be incorporated into the microprocessor 54 and used to translate a temperature change into a frequency shift, whereby the bias voltage can be adjusted to achieve the desired center frequency.

While the above description constitutes the preferred embodiment of the invention, it will be appreciated that the invention is susceptible to modification, variation, and change without departing from the proper scope or fair meaning of the accompanying claims.

What is claimed is:

1. A method for aligning the frequency of a transmitter device, comprising the steps of:

providing a voltage-controlled oscillator for driving the transmitter device and an amplifier circuit interposed between the oscillator and the transmitter device, wherein the oscillator is adapted to receive a bias voltage from an adjustable voltage source;

applying a bias voltage to the oscillator; and adjusting to bias voltage from the adjustable voltage source, thereby aligning the frequency of the transmitter device.

2. The method of claim 1 wherein the step of adjusting the bias voltage further comprises the steps of:

receiving an output signal from the transmitter device into a receiver device;

determining a frequency associated with the output signal; and adjusting the bias voltage from the adjustable voltage source based on the frequency associated with the output signal from the transmitter device.

3. The method of claim 1 wherein the step of providing a voltage-controlled oscillator further comprises using a varactor diode to provide a portion of the capacitance associated with the oscillator and the varactor diode is adapted to receive the bias voltage from the adjustable voltage source.

4. The method of claim 1 wherein the step of providing a voltage-controlled oscillator further comprises using a Hartley oscillator circuit.

5. The method of claim 1 wherein the step of providing a voltage-controlled oscillator further comprises using a microprocessor as the adjustable voltage source.

6. The method of claim 5 further comprising the step of using a thermistor circuit connected to the microprocessor for providing a voltage level proportional to the ambient temperature adjacent to the oscillator.

7. The method of claim 6 further comprising the step of adjusting the bias voltage based on the voltage level from the thermistor circuit, thereby improving the temperature stability of the oscillator circuit.

8. A method for aligning the center frequency of an infrared transmitter, comprising the steps of:

providing a voltage-controlled oscillator for driving the infrared transmitter and an amplifier circuit interposed between the oscillator and the infrared transmitter, wherein the oscillator is adapted to receive a bias voltage from a microprocessor;

applying a bias voltage to the oscillator;

receiving and output signal from the infrared transmitter into an infrared receiver;

determining a frequency associated with the output signal; and adjusting to bias voltage from the microprocessor based on the frequency associated with the output signal, thereby aligning the center frequency of the infrared transmitter.

* * * * *